United States Patent
Ishii et al.

(10) Patent No.: US 11,482,398 B2
(45) Date of Patent: Oct. 25, 2022

(54) FOCUSED ION BEAM APPARATUS

(71) Applicant: HITACHI HIGH-TECH SCIENCE CORPORATION, Tokyo (JP)

(72) Inventors: Haruyuki Ishii, Tokyo (JP); Atsushi Uemoto, Tokyo (JP); Tatsuya Asahata, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/028,488

(22) Filed: Sep. 22, 2020

(65) Prior Publication Data
US 2021/0090849 A1 Mar. 25, 2021

(30) Foreign Application Priority Data
Sep. 25, 2019 (JP) .............................. JP2019-174442

(51) Int. Cl.
*H01J 37/20* (2006.01)
*H01J 37/28* (2006.01)

(52) U.S. Cl.
CPC .............. *H01J 37/20* (2013.01); *H01J 37/28* (2013.01); *H01J 2237/20207* (2013.01); *H01J 2237/20214* (2013.01); *H01J 2237/31749* (2013.01)

(58) Field of Classification Search
None
See application file for complete search history.

(56) References Cited

U.S. PATENT DOCUMENTS

| | | | | |
|---|---|---|---|---|
| 5,329,125 A | * | 7/1994 | Feuerbaum | H01J 37/20 250/442.11 |
| 7,298,495 B2 | * | 11/2007 | Lewis | H01J 37/20 356/500 |
| 2002/0079463 A1 | * | 6/2002 | Shichi | G01N 1/286 250/492.1 |
| 2004/0158409 A1 | * | 8/2004 | Teshima | H01J 37/302 702/22 |
| 2006/0192118 A1 | * | 8/2006 | Tashiro | G01N 23/2251 250/310 |
| 2006/0226376 A1 | * | 10/2006 | Fujii | H01J 37/21 250/492.21 |

(Continued)

FOREIGN PATENT DOCUMENTS

| | | | | |
|---|---|---|---|---|
| JP | 2011203266 A | * | 10/2011 | |
| JP | 2016-072089 A | | 5/2016 | |
| WO | WO-2007066544 A1 | * | 6/2007 | ............. H01J 37/20 |

*Primary Examiner* — Andrew Smyth
(74) *Attorney, Agent, or Firm* — Holland & Hart LLP

(57) ABSTRACT

The focused ion beam apparatus includes: an electron beam column; a focused ion beam column; a sample stage; a coordinate acquisition unit configured to acquire, when a plurality of irradiation positions to which the focused ion beam is to be applied are designated on a sample, plane coordinates of each of the irradiation positions; a movement amount calculation unit configured to calculate, based on the plane coordinates, a movement amount by which the sample stage is to be moved to a eucentric height so that the eucentric height matches an intersection position at which the electron beam and the focused ion beam match each other at each of the irradiation positions; and a sample stage movement control unit configured to move, based on the movement amount, the sample stage to the eucentric height at each of the irradiation positions.

2 Claims, 9 Drawing Sheets

(56) References Cited

U.S. PATENT DOCUMENTS

| | | | | |
|---|---|---|---|---|
| 2007/0045560 | A1* | 3/2007 | Takahashi | H01J 37/304 250/442.11 |
| 2007/0125958 | A1* | 6/2007 | Tappel | H01L 21/68764 250/441.11 |
| 2008/0250881 | A1* | 10/2008 | Dona | H01J 37/20 73/864.91 |
| 2008/0315088 | A1* | 12/2008 | Takahashi | H01J 37/3056 250/306 |
| 2011/0309245 | A1* | 12/2011 | Madokoro | G01N 1/286 250/307 |
| 2013/0248707 | A1* | 9/2013 | Man | H01J 37/265 250/307 |
| 2013/0344292 | A1* | 12/2013 | Bugge | H01J 37/28 428/157 |
| 2014/0070113 | A1* | 3/2014 | Straw | H01J 37/228 250/453.11 |
| 2019/0013178 | A1* | 1/2019 | Zachreson | H01J 37/228 |
| 2019/0108971 | A1* | 4/2019 | Vaske | H01J 37/244 |
| 2019/0198287 | A1* | 6/2019 | Vystavel | H01J 37/244 |
| 2019/0198288 | A1* | 6/2019 | Maazouz | H01J 37/261 |
| 2019/0259569 | A1* | 8/2019 | Suzuki | H01J 37/20 |
| 2019/0355548 | A1* | 11/2019 | Biberger | H01J 37/20 |
| 2020/0035444 | A1* | 1/2020 | Nicoletti | H01J 37/20 |
| 2021/0163888 | A1* | 6/2021 | Tesar | C12N 5/0622 |

* cited by examiner

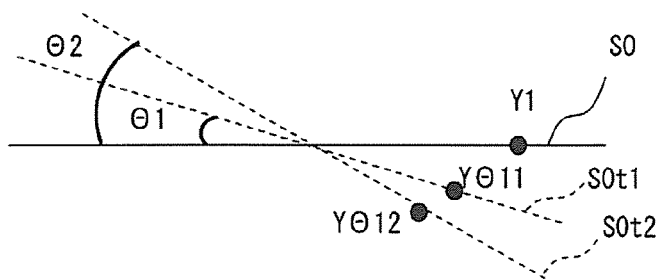
FIG. 9
| APPARATUS NUMBER ○○ | EXPECTED L |
|---|---|
|  | ... |
FIG. 10A
| ACCELERATION VOLTAGE OF SEM | EXPECTED L |
|---|---|
| ○～△ | ... |
| △～× | ... |
FIG. 10B
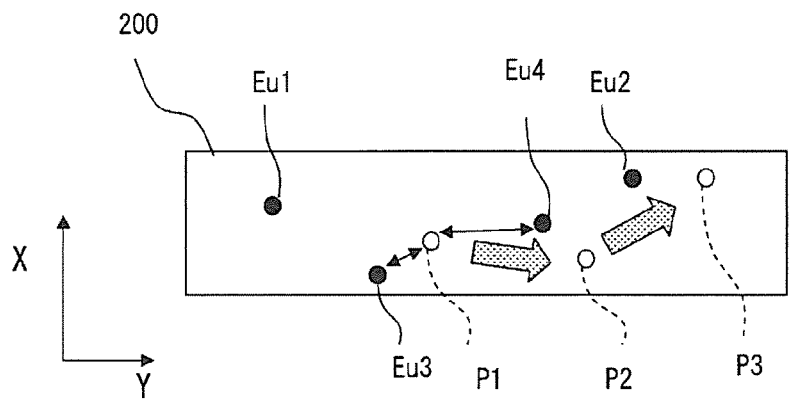
FIG. 11

|     | X    | Y    | R     | Le  | Zse   |
|-----|------|------|-------|-----|-------|
| Eu1 | 77.5 | 77.5 | 12.00 | 0.2 | 12.00 |
| Eu2 | 125  | 100  | 12.50 | 0.5 | 12.50 |
| Eu3 | ...  | ...  | ...   | ... | ...   |
| Eu4 | ...  | ...  | ...   | ... | ...   |
| Eu5 | ...  | ...  | ...   | ... | ...   |
| Eu6 | ...  | ...  | ...   | ... | ...   |
| Eu7 | 77.5 | 77.5 | 90.00 | 0.4 | 11.95 |
| Eu8 | 125  | 100  | 90.00 | 0.1 | 12.10 |
| ... | ...  | ...  | ...   | ... | ...   |

6T

FOCUSED ION BEAM APPARATUS

The present application claims priorities to Japanese Patent Application No. 2019-174442, filed Sep. 25, 2019, the entire contents of which is incorporated herein for all purposes by this reference.

BACKGROUND OF THE INVENTION

1. Field of the Invention

The present invention relates to a focused ion beam apparatus including an electron beam column and a focused ion beam column.

2. Description of the Related Art

Hitherto, there has been used an FIB-SEM apparatus in which a scanning electron microscope (SEM) is further mounted with a focused ion beam column configured to irradiate a sample with a focused ion beam (FIB) to form a cross section. With this configuration, the cross section processed through use of the focused ion beam can be irradiated with an electron beam from the SEM, and processing for the cross section of a sample and the observation and measurement of the cross section can be performed on the spot in one apparatus.

Incidentally, when a specific position on a sample is processed or observed while the sample is tilted by driving a stage through use of an FIB apparatus, the specific position may fall out of a field of view due to a tilting operation.

Therefore, there has been developed an FIB apparatus including a stage mechanism for placing the sample at a eucentric height so as to prevent the specific position from falling out of the field of view even through the tilting operation (see Japanese Patent Application Laid-open No. 2016-72089).

In this case, the "eucentric height" represents a height of a sample stage exhibited when a specific position on an observation image does not move even in a case where the sample is tilted during observation with the sample being placed on the sample stage. In the case of the FIB-SEM apparatus, a height of the stage is adjusted so that an intersection position between the focused ion beam and the electron beam matches a sample position (eucentric position) on the stage at the eucentric height. That is, the eucentric position is a height obtained by adding a thickness of the sample (and a thickness of a sample holder when the sample holder is used) to the eucentric height.

With this configuration, even when FIB processing and SEM observation of the specific position on the sample are performed while the tilting operation is being performed, the specific position does not fall out of the field of view of the FIB and SEM before and after the tilting operation. Therefore, the processing can be efficiently observed.

However, when a focused ion beam is used to process a sample, there is a demand for processing at a plurality of positions on the surface of the sample, and it is complicated to adjust a tilt axis of a sample stage to a eucentric height every time the sample stage is moved to each position.

In addition, measurement may be performed on the assumption that the eucentric height adjusted and determined at a first position is constant at other positions. However, the eucentric height changes due to, for example, irregularities of the sample, and hence there is a fear in that a target region may fall out of a field of view when the sample is tilted.

SUMMARY OF THE INVENTION

The present invention has been made in order to solve the above-mentioned problems, and has an object to provide a focused ion beam apparatus capable of automatically and accurately adjusting each of a plurality of irradiation positions of a focused ion beam on a sample to a eucentric height.

In order to achieve the above-mentioned object, a focused ion beam apparatus according to at least one embodiment of the present invention includes: an electron beam column configured to irradiate a sample with an electron beam; a focused ion beam column configured to irradiate the sample with a focused ion beam; a sample stage, on which the sample is to be placed in one of a direct manner and an indirect manner, and which is tiltable about a tilt axis perpendicular to the electron beam and the focused ion beam and movable in a height direction; a coordinate acquisition unit configured to acquire, when a plurality of irradiation positions to which the focused ion beam is to be applied are designated on the sample, plane coordinates of each of the plurality of irradiation positions; a movement amount calculation unit configured to calculate, based on the plane coordinates, a movement amount by which the sample stage is to be moved to a eucentric height ($Zs$) so that the eucentric height ($Zs$) matches an intersection position at which the electron beam and the focused ion beam match each other at each of the plurality of irradiation positions; and a sample stage movement control unit configured to move, based on the movement amount, the sample stage to the eucentric height ($Zs$) at each of the plurality of irradiation positions.

According to the above-mentioned focused ion beam apparatus, after the focused ion beam is applied to perform, for example, various kinds of processing and deposition with the irradiation position on the surface of the sample being set to the eucentric position, observation or another such operation can be performed with the irradiation position being tilted by a predetermined angle.

After the processing and observation at the irradiation position are finished, each of the subsequent irradiation positions is automatically adjusted to the eucentric height, to thereby improve work efficiency. In addition, as compared to a case in which the eucentric height is manually set, it is possible to inhibit each irradiation position from falling out of the eucentric height, and it is also possible to inhibit each irradiation position from falling out of the field of view when the sample is tilted.

In the focused ion beam apparatus according to at least one embodiment of the present invention, the sample stage movement control unit may be configured to move the sample stage in a Y-axis direction parallel to a horizontal plane of the sample stage and perpendicular to the tilt axis so as to compensate a deviation amount ($L$) at the irradiation position in the Y-axis direction.

For example, the deviation amount ($L$) in the Y-axis direction may be caused not only by deviations exhibited when a moving mechanism for the sample stage is moved to each irradiation position, due to mounting errors (machine differences) among the sample stages of individual focused ion beam apparatus, and by deviations of actual movement amounts of a piezo element, a stepping motor, and other actuators that form the moving mechanism, but also by a bend from a beam axis of an electron beam for generating an SEM image of the sample, which is exhibited when the eucentric height is determined, and by other such factors.

In view of this, according to the above-mentioned focused ion beam apparatus, the deviation amount ($L$) is compensated, and hence it is possible to suppress the falling out of, for example, an observation position of the sample.

In the focused ion beam apparatus according to at least one embodiment of the present invention, the sample stage movement control unit may be configured to calculate the movement amount by reflecting variations in eucentric height (Zs) derived from the deviation amount (L).

According to the above-mentioned focused ion beam apparatus, the deviation amount (L) is compensated, and hence measurement accuracy of the eucentric height (Zs) is improved.

In the focused ion beam apparatus according to at least one embodiment of the present invention, the deviation amount (L) may have one of a predetermined value that is estimated and a calculated value that is obtained when the movement amount calculation unit calculates the eucentric height (Zs).

The focused ion beam apparatus according to at least one embodiment of the present invention may further include a memory configured to store a eucentric height (Zse) at predetermined plane coordinates on the surface of the sample placed on the sample stage, and the movement amount calculation unit may be configured to refer to the eucentric height (Zse) stored in the memory to estimate the eucentric height (Zs) at each of the plurality of irradiation positions based on a difference in coordinate between the predetermined plane coordinates and each of the plurality of irradiation positions.

According to the above-mentioned focused ion beam apparatus, it is not required to calculate a eucentric height (Zs) for each of a plurality of irradiation positions every time processing is performed, and it is possible to automate continuous processing and observation at a plurality of irradiation positions.

In the focused ion beam apparatus according to at least one embodiment of the present invention, the memory may be configured to store a deviation amount (Le) at the predetermined plane coordinates in association with the eucentric height (Zse), and the movement amount calculation unit may be configured to refer to the deviation amount (Le) stored in the memory to further estimate the deviation amount (L) at each of the plurality of irradiation positions based on the difference in coordinate between the predetermined plane coordinates and each of the plurality of irradiation positions.

According to the above-mentioned focused ion beam apparatus, the deviation amount (L) can be estimated without calculating the eucentric height (Zs) for each of a plurality of irradiation positions every time processing is performed.

In the focused ion beam apparatus according to at least one embodiment of the present invention, the memory may be configured to store a rotation angle having an R value about an axis perpendicular to a relevant plane, which is exhibited when the eucentric height (Zse) at the predetermined plane coordinates is measured, in association with the deviation amount (Le) and the eucentric height (Zse), and the movement amount calculation unit may be configured to refer to the R value stored in the memory to estimate the deviation amount (L) at each of the plurality of irradiation positions based on a similarity degree between the R value at the predetermined plane coordinates and the R value at each of the plurality of irradiation positions.

According to the above-mentioned focused ion beam apparatus, the predetermined plane coordinates are extracted from the memory in consideration of a similarity degree between the R values that exert an influence on the deviation amount (L), and hence estimation accuracy of the deviation amount (L) is improved.

According to at least one embodiment of the present invention, it is possible to automatically and accurately adjust each of the plurality of irradiation positions of the focused ion beam on the sample to the eucentric height.

BRIEF DESCRIPTION OF THE DRAWINGS

FIG. 9 is a diagram for illustrating a method of tilting a surface of a sample at two tilt angles to calculate both Zs and L.

FIG. 10A and FIG. 10B show tables (mappings) for estimating L.

FIG. 11 is an XY plan view of the sample placed on the sample stage.

DESCRIPTION OF THE EMBODIMENTS

Now, at least one embodiment of the present invention is described with reference to the accompanying drawings. In the following description, like components are denoted by like reference symbols.

Figure 1:
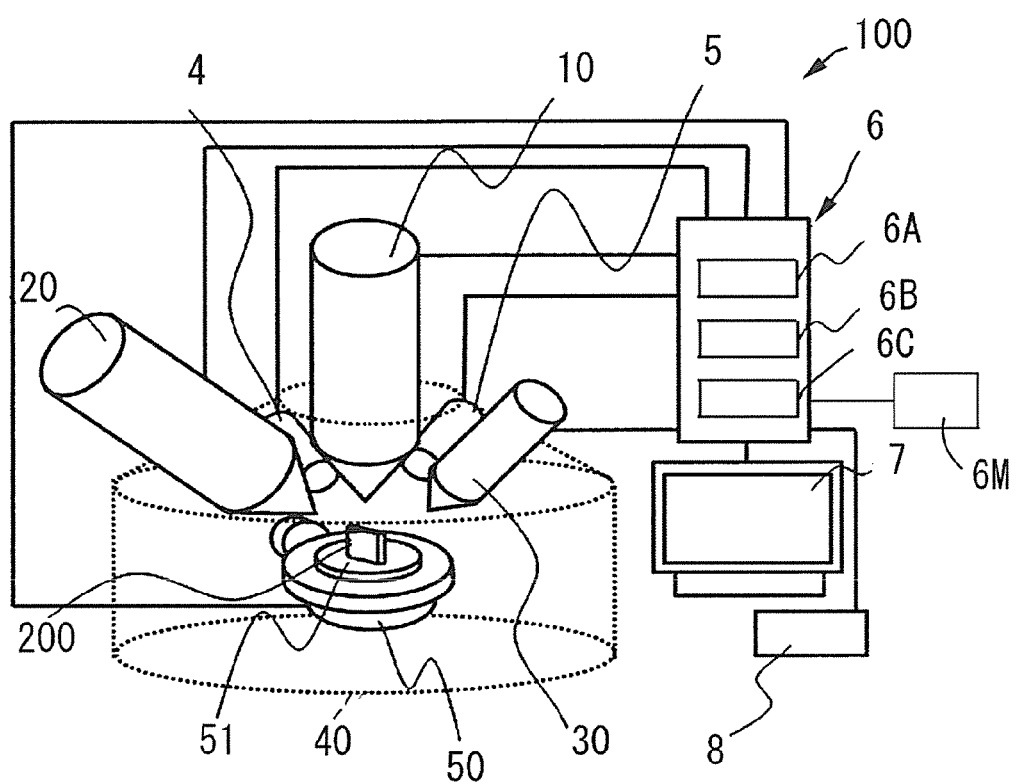
FIG. 1 is a diagram for illustrating an overall configuration of a focused ion beam apparatus according to at least one embodiment of the present invention.

FIG. 1 is a block diagram for illustrating an overall configuration of a focused ion beam apparatus 100 according to at least one embodiment of the present invention. In FIG. 1, the focused ion beam apparatus 100 includes an electron beam column (SEM column) 10, a focused ion beam column (FIB column) 20, a gas ion beam column 30, a secondary electron detector 4, a gas gun 5, a control unit 6, a display unit 7, an input unit 8, a sample stage 50, and a sample table (sample holder) 51 arranged on the sample stage 50.

A part or all of the components of the focused ion beam apparatus 100 are arranged in a vacuum chamber 40, and the inside of the vacuum chamber 40 is depressurized to a predetermined vacuum degree.

The sample stage 50 is configured to movably support the sample table 51, and a sample 200 is placed on the sample table 51. The sample stage 50 also has a moving mechanism capable of displacing the sample table 51 on five axes.

Specifically, this moving mechanism includes an XY moving mechanism 50xy for moving the sample table 51 along an X-axis and a Y-axis, which are parallel to a horizontal plane and perpendicular to each other, a Z moving mechanism 50z for moving the sample table 51 along a Z-axis (height direction) perpendicular to the X-axis and the Y-axis, a rotation mechanism 50r for rotating the sample table 51 about the Z-axis, and a tilt mechanism 50t for rotating the sample table 51 about a tilt axis TA parallel to the X-axis. The tilt axis TA is perpendicular to irradiation directions of an electron beam 10A and a focused ion beam 20A.

The above-mentioned moving mechanism can be achieved by a piezo element, a stepping motor, and other various actuators.

Figure 2:
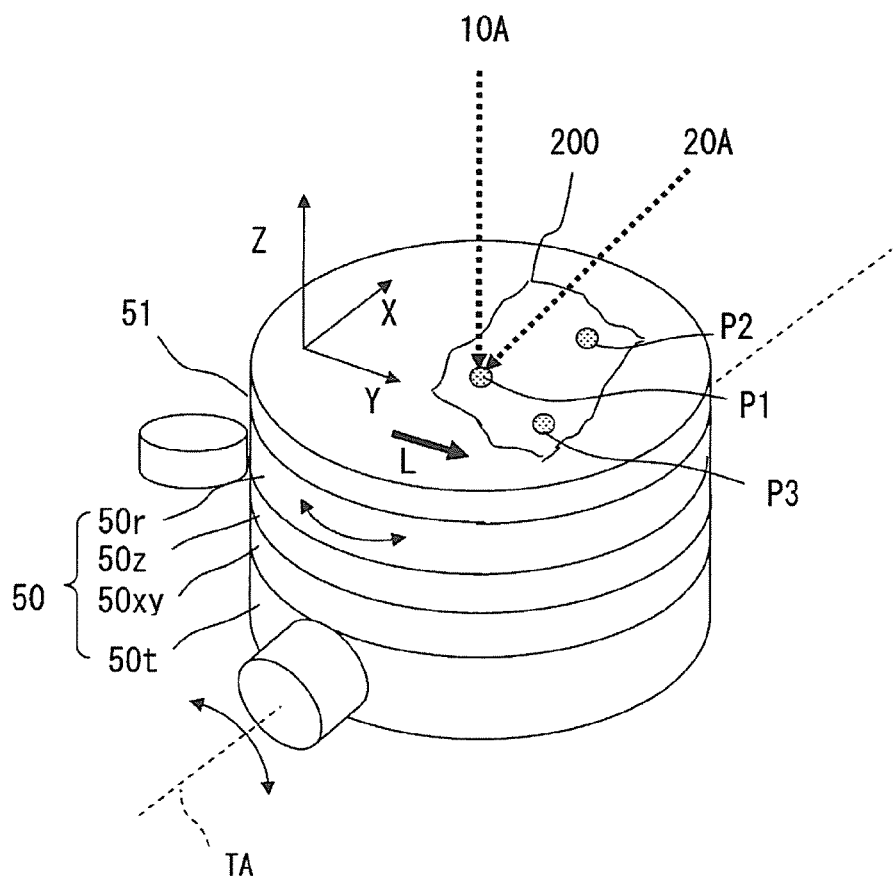
FIG. 2 is an enlarged perspective view of a sample stage.

The sample stage 50 displaces the sample table 51 on the five axes, to thereby move the sample 200 to a plurality of irradiation positions of the electron beam 10A, the focused ion beam 20A, and a gas ion beam 30A (irradiation points (positions) P1, P2, and P3, at which the irradiation beams 10A to 30A intersect one another, and which are illustrated in FIG. 2).

At the irradiation points P1 to P3, the surface (cross section) of the sample 200 is irradiated with the electron beam 10A, the focused ion beam 20A, and the gas ion beam 30A (in FIG. 2, only the electron beam 10A and the focused ion beam 20A are illustrated), to thereby perform processing and SEM observation.

The control unit 6 can be formed of a computer including a CPU serving as a central processing unit, a memory 6M (RAM and ROM) configured to store, for example, data and programs, an input port configured to receive input of a signal from an external apparatus, and an output port configured to output a signal to the external apparatus. The control unit 6 is configured so that the CPU executes various kinds of calculation processing based on the programs stored in the memory 6M to control the components of the focused ion beam apparatus 100. Further, the control unit 6 is electrically connected to, for example, control wirings of the electron beam column 10, the focused ion beam column 20, the gas ion beam column 30, the secondary electron detector 4, and the sample stage 50.

The control unit 6 includes a coordinate acquisition unit 6A, a movement amount calculation unit 6B, and a sample stage movement control unit 6C, which are described later.

The control unit 6 is also configured to drive the sample stage 50 based on a command from software or input performed by an operator to adjust the position and posture of the sample 200, to thereby adjust the irradiation positions and irradiation angles of the electron beam 10A, the focused ion beam 20A, and the gas ion beam 30A for irradiating the surface of the sample 200.

The control unit 6 is connected to the input unit 8, for example, a keyboard, for acquiring an instruction input by the operator, and the display unit 7 configured to display, for example, an image of a sample.

The SEM column 10 includes an electron source (not shown) configured to emit electrons and an electron optical system (not shown) configured to form the electrons emitted from the electron source into a beam shape and to scan the electrons. When the sample 200 is irradiated with the electron beam 10A emitted from the electron beam column 10, secondary electrons are generated from the sample 200.

The generated secondary electrons are detected by a secondary electron detector (not shown) inside the column or the secondary electron detector 4 outside the column, to thereby be able to acquire the image of the sample 200. In another case, reflected electrons are detected by a reflected electron detector 14 inside the column, to thereby be able to acquire the image of the sample 200.

The electron optical system includes, for example, a condenser lens configured to focus the electron beam 10A, an aperture configured to narrow down the electron beam 10A, an aligner configured to adjust an optical axis of the electron beam 10A, an objective lens configured to focus the electron beam 10A onto the sample 200, and a deflector configured to scan the electron beam 10A on the sample 200.

The FIB column 20 includes an ion source (not shown) configured to generate ions and an ion optical system (not shown) configured to form the ions emitted from the ion source into a focused ion beam shape and to scan the ions. When the sample 200 is irradiated with the focused ion beam 20A being a charged particle beam from the FIB column 20, secondary ions, secondary electrons, and other such secondary charged particles are generated from the sample 200. Those secondary charged particles are detected by the secondary electron detector 4 to acquire the image of the sample 200. The FIB column 20 also increases an irradiation amount of the focused ion beam 20A to perform etching processing (cross-section processing) on the sample 200 within an irradiation range.

The ion optical system has a known configuration, and includes, for example, a condenser lens configured to focus the focused ion beam 20A, an aperture configured to narrow down the focused ion beam 20A, an aligner configured to adjust an optical axis of the focused ion beam 20A, an objective lens configured to focus the focused ion beam 20A on the sample, and a deflector configured to scan the focused ion beam 20A on the sample.

The gas ion beam column 30 includes, for example, an ion source (not shown) configured to generate ions being argon ions, a condenser lens (not shown) configured to focus the ion beam emitted from the ion source, a blanking unit (not shown), an aperture (not shown) configured to narrow down the ion beam, and an objective lens (not shown) configured to focus the ion beam.

The gas gun 5 emits a predetermined gas, for example, an etching gas, to the sample 200. The sample 200 is irradiated with the electron beam 10A, the focused ion beam 20A, or the gas ion beam 30A while the etching gas is being supplied from the gas gun 5, to thereby be able to increase an etching speed of the sample through beam irradiation. In another case, the sample 200 is irradiated with the electron beam 10A, the focused ion beam 20A, or the gas ion beam 30A while a compound gas is being supplied from the gas gun 5, to thereby be able to perform local precipitation (deposition) of gas components in the vicinity of abeam irradiation area.

First Embodiment

Figure 3:
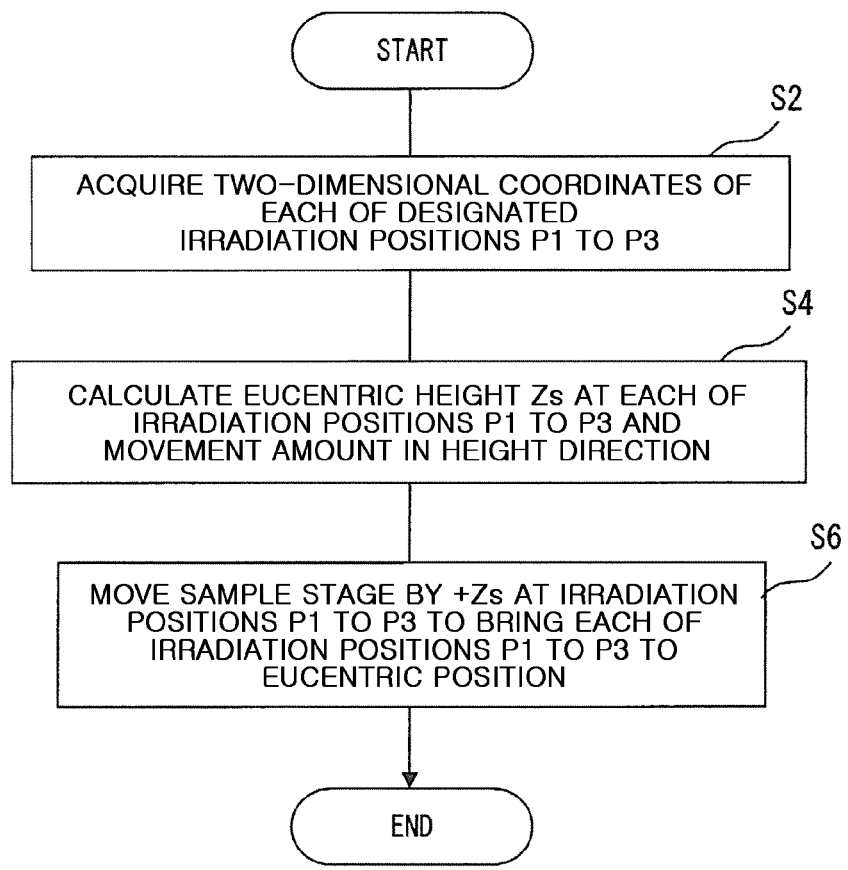
FIG. 3 is a diagram for illustrating a processing flow to be performed by the focused ion beam apparatus according to a first embodiment of the present invention.

Next, with reference to FIG. 3, a processing flow to be performed by the focused ion beam apparatus 100 according to a first embodiment of the present invention is described.

First, as illustrated in FIG. 2, the user designates the plurality of irradiation positions P1 to P3 for irradiating the sample 200 with the focused ion beam 20A. In regard to this designation, for example, when the user clicks a predetermined position on an SEM image of the sample 200 on the display unit 7, the control unit 6 can acquire this position.

After acquiring the designated irradiation positions P1 to P3, the control unit 6 (coordinate acquisition unit 6A) acquires plane (XY) coordinates of each of the irradiation positions P1 to P3 (Step S2).

Subsequently, the control unit 6 (movement amount calculation unit 6B) calculates a eucentric height Zs at each of the irradiation positions P1 to P3 and a movement amount in the height direction (Step S4).

This movement amount is an amount by which the sample stage 50 is to be moved in the height direction so as to reach the eucentric height Zs, to thereby cause each of the irradiation positions P1 to P3 of the sample, which are illustrated in FIG. 2, to become a eucentric position.

Figure 4:
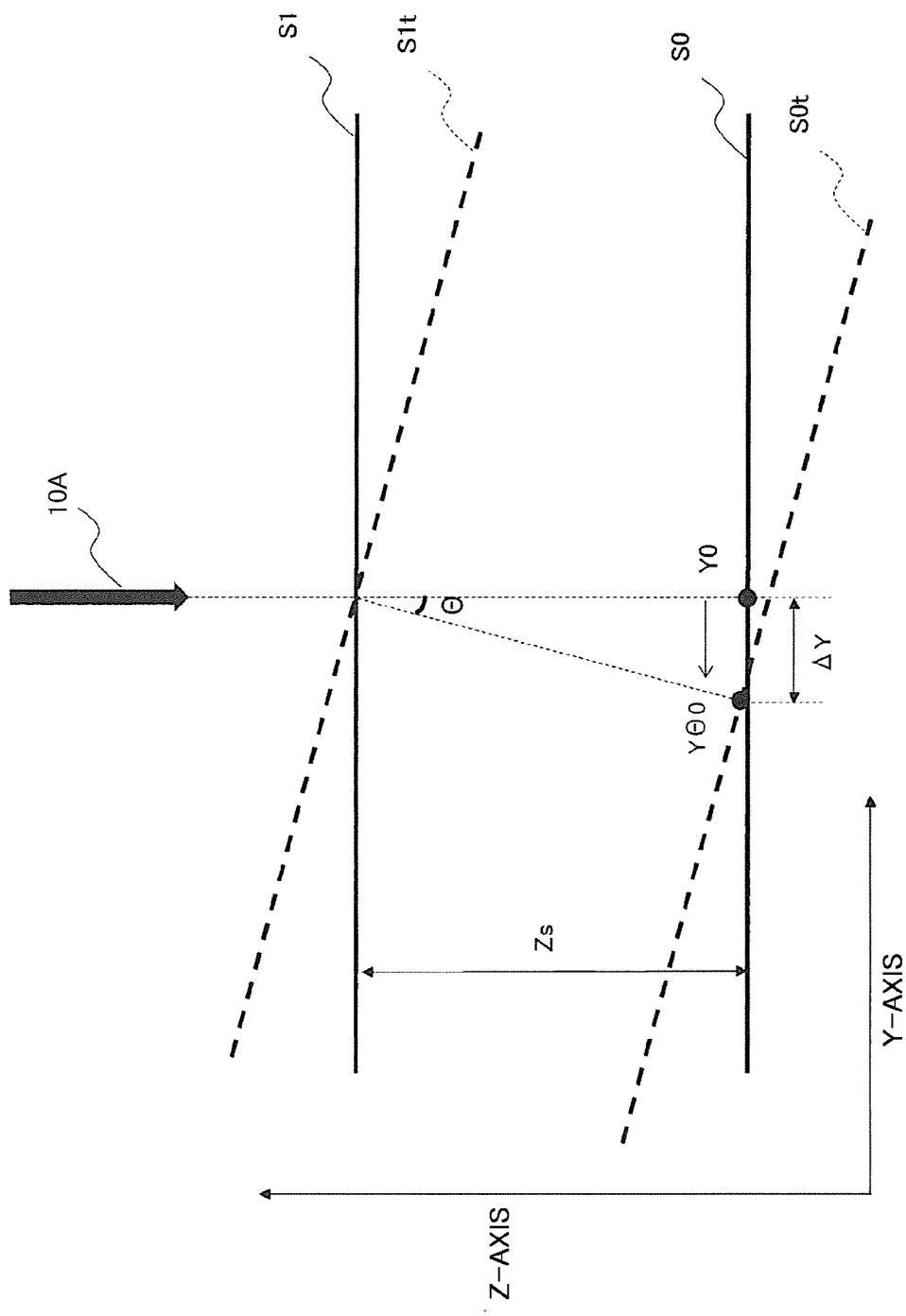
FIG. 4 is a diagram for illustrating an example of a method of calculating a eucentric height Zs in the first embodiment.

Now, with reference to FIG. 4, an example of a method of calculating each eucentric height Zs at each of the irradiation positions P1 to P3 is described. The method of FIG. 4 is applied when it is assumed that the deviation L in the Y-axis direction does not occur (or can be ignored) when the eucentric height Zs is calculated.

In FIG. 4, first, a sample surface S0 before a tilt is irradiated with the electron beam 10A from a predetermined direction (vertical direction in FIG. 4) to acquire a Y coordinate (Y0) of the irradiation position P1. The acquisition of the Y coordinate corresponds to Step S2 of FIG. 3.

Subsequently, the control unit 6 tilts the sample about the tilt axis TA by an angle Θ so that the sample is tilted to have a surface S0t. At this time, the Y coordinate of the irradiation position P1 is moved to YΘ0 by ΔY (moved to the left side in FIG. 4).

The movement amount obtained at this time is approximated by the following expression:

$$\Delta Y = Y0 - Y\Theta 0 \approx Zs \times \sin \Theta \qquad \text{Expression 2:}$$

where Y0, YΘ0, and Θ are known. Therefore, Zs can be obtained by the following expression:

$$Zs = (Y0 - Y\Theta 0)/\sin \Theta \qquad \text{Expression 3:}$$

Expression 2 is recorded in the memory 6M or recorded in a program for calculating the eucentric height Zs to be readout by the control unit 6.

Then, the control unit 6 (sample stage movement control unit 6C) controls the Z moving mechanism 50z to move the sample surface S0 in the height direction by a eucentric height (+Zs) to bring a sample surface S1 (irradiation position P1) to the eucentric position (Step S6 of FIG. 3).

YΘ0 itself cannot be usually discerned by viewing the SEM image. In view of this, when there is a feature shape (for example, dent that can be distinguished from the surroundings) at the irradiation position P1 itself, the movement amount of the feature shape in the Y-axis direction before and after the tilt may be calculated.

Figure 5:
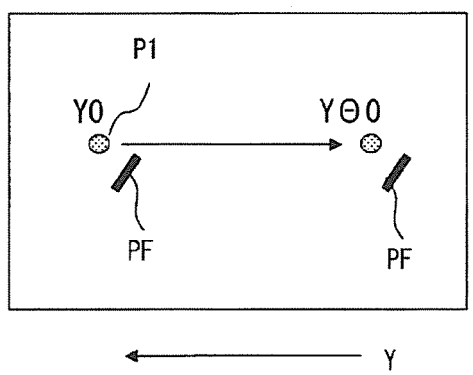
FIG. 5 is a diagram for illustrating irradiation positions before and after a tilt.

Meanwhile, as illustrated in FIG. 5, when there is no feature shape at the irradiation position P1 itself, a displacement of a feature shape PF near the irradiation position P1 in the Y-axis direction before and after the tilt may be calculated.

In this manner, after the focused ion beam 20A is applied to perform, for example, various kinds of processing and deposition with the irradiation position P1 on the surface of the sample being set to the eucentric position, the irradiation position P1 can be observed by applying the electron beam 10A with the irradiation position P1 being tilted by a predetermined angle.

After the processing and observation at the irradiation position P1 are finished, each of the subsequent irradiation positions P2 and P3 is automatically adjusted to the eucentric height Zs, to thereby improve work efficiency. In addition, as compared to a case in which the eucentric height is manually set, it is possible to inhibit each of the irradiation positions P1 to P3 from falling out of the eucentric height Zs, and it is also possible to inhibit each of the irradiation positions P1 to P3 from falling out of the field of view when the sample is tilted.

Figure 6:
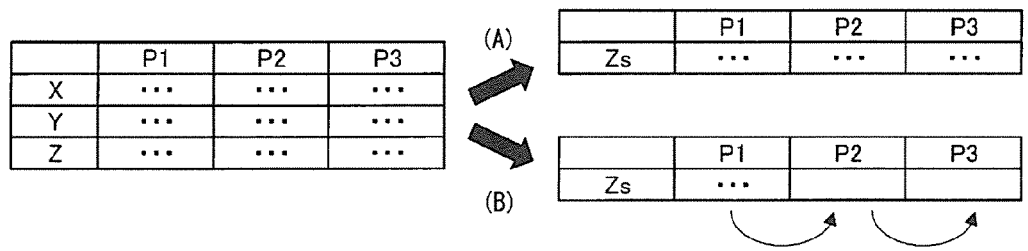
FIG. 6 is a set of tables for showing an example of a calculation sequence of the eucentric height Zs and a movement amount in a height direction.

In Step S4 of FIG. 3, the eucentric height Zs and the movement amount in the height direction may be calculated as indicated by the arrow (A) in FIG. 6 by calculating the eucentric heights Zs of the irradiation positions P1 to P3 at once after the XY coordinates of the irradiation positions P1 to P3 are acquired in Step S2 of FIG. 3 before FIB irradiation and SEM image measurement are performed at the irradiation position P1.

In addition, as indicated by the arrow (B) in FIG. 6, the eucentric height Zs at the irradiation position P1 may be calculated after the XY coordinates of the irradiation positions P1 to P3 are acquired in Step S2 of FIG. 3 before the FIB irradiation and the SEM image measurement are performed at the irradiation position P1, and the eucentric height Zs at the irradiation position P2 may be subsequently calculated after the FIB irradiation and the SEM image measurement at the irradiation position P1 are finished.

Second Embodiment

Figure 7:
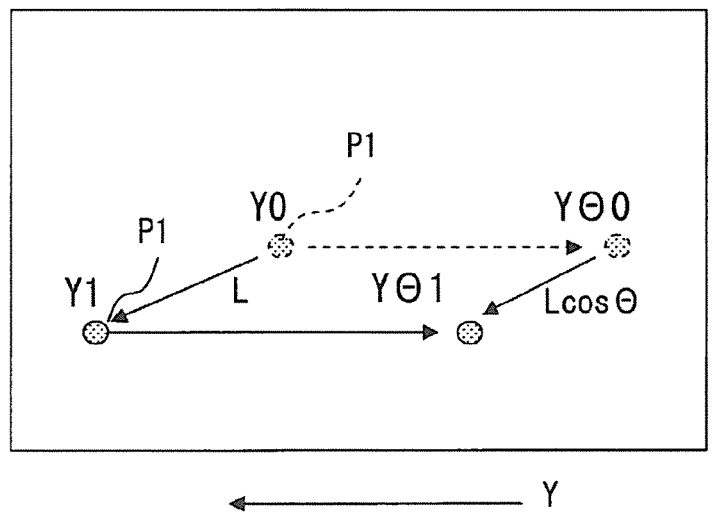
FIG. 7 is a diagram for illustrating irradiation positions before and after a tilt, which are exhibited when a deviation L in the Y-axis direction has occurred.
Figure 8:
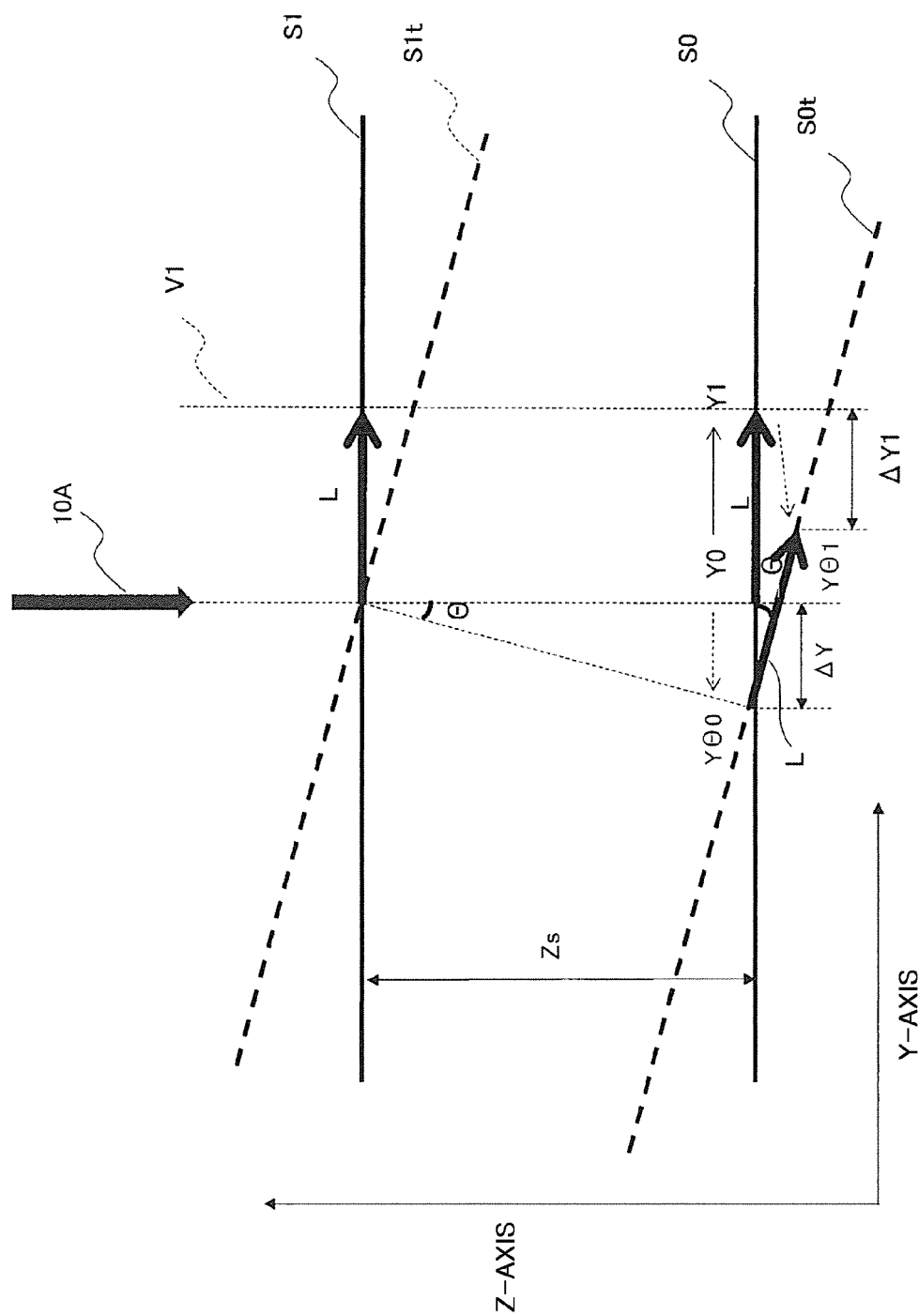
FIG. 8 is a diagram for illustrating an example of a method of calculating the eucentric height Zs in a second embodiment of the present invention.

Next, with reference to FIG. 7 and FIG. 8, a method of calculating the eucentric height Zs, which is to be performed in the focused ion beam apparatus 100 according to a second embodiment of the present invention (Step S4 of FIG. 3) is described. The second embodiment is the same as the first embodiment except that the above-mentioned method of calculating the eucentric height Zs in Step S4 is different.

The second embodiment is applied when the deviation L in the Y-axis direction occurs at the time of calculation of the eucentric height Zs, and exhibits increased calculation accuracy of the eucentric height Zs than that of the method of FIG. 4.

In this case, for example, the deviation L is caused not only by deviations exhibited when the moving mechanism for the sample stage 50 is moved to each of the irradiation positions P1 to P3, due to mounting errors (machine differences) among the sample stages 50 of individual focused ion beam apparatus, and by deviations of actual movement amounts of a piezo element, a stepping motor, and other actuators that form the moving mechanism, but also by a bend from a beam axis of the electron beam 10A for generating the SEM image, which is exhibited when Y0 and YΘ0 described above are determined, and by other such factors.

In addition, the bend from the beam axis of the electron beam 10A is ascribable to measurement conditions including an acceleration voltage and an aperture.

FIG. 7 is a schematic diagram for illustrating a change of the irradiation position P1 between before and after the tilt by the angle Θ, which is exhibited when the deviation L in the Y-axis direction occurs. FIG. 8 is a diagram for illustrating the method of calculating the eucentric height Zs, which is to be performed when the deviation L in the Y-axis direction occurs.

As illustrated in FIG. 7, when the deviation L in the Y-axis direction occurs, the irradiation position of the electron beam 10A deviates to V1 due to the deviation L on the sample surface S0 before a tilt. Then, the Y coordinate of the irradiation position P1 before the tilt becomes Y1, which is moved by L from Y0 (ideal position exhibited when there is no deviation L and corresponding to FIG. 4). Then, the Y coordinate of the irradiation position P1 after the tilt becomes YΘ1, which is moved by LxcosΘ from YΘ0 (ideal position exhibited when there is no deviation L and corresponding to FIG. 4).

Details of those positional relationships are described with reference to FIG. 8.

First, on the sample surface S0 before a tilt, the irradiation position of the electron beam 10A is deviated to V1 due to the deviation L, and the Y coordinate of the irradiation position P1 is expressed by the following expression:

$$Y1 = Y0 + L \quad \text{Expression 4:}$$

Subsequently, at the irradiation position P1 on a sample surface S0$t$ tilted by the angle Θ, the deviation L also is tilted by the angle Θ, and hence a Y-axis component of the deviation L becomes LxcosΘ. Therefore, the Y coordinate of the irradiation position P1 after the tilt is expressed by the following expression:

$$Y\Theta1 = Y\Theta0 + L \times \cos\Theta \quad \text{Expression 5:}$$

In this case, when Expression 2 and Expression 4 are substituted into Expression 5, the following expression is obtained.

$$Y\Theta1 = (Y0 - Zs \times \sin\Theta) + L \times \cos\Theta \quad \text{Expression 1}$$
$$= Y1 - L - Zs \times \sin\Theta + L \times \cos\Theta$$
$$= Y1 - Zs \times \sin\Theta + (\cos\Theta - 1) \times L$$

In Expression 1, Y1, sin Θ, and cos Θ are known, and Zs and L are unknown.

In view of this, as illustrated in FIG. 9, when Y coordinates YΘ1 (YΘ11 and YΘ12) are acquired on sample surfaces S0$t$1 and S0$t$2, which are tilted at two different tilt angles Θ (Θ1 and Θ2), respectively, at the same irradiation position P1, two Expressions 1 are obtained.

Therefore, there are two unknowns (Zs and L) in two simultaneous equations, and hence Zs and L can be calculated together.

Then, with Zs and L described above, a highly accurate eucentric height Zs is obtained, and at the same time, the deviation L in the Y-axis direction is found. Thus, the sample stage movement control unit 6C is only required to tilt the sample stage 50 after moving the sample stage 50 by L in the Y-axis direction so as to compensate a deviation amount L.

Therefore, even when the deviation L in the Y-axis direction occurs, it is possible to inhibit a target region from falling out of the field of view when the sample is tilted.

L is sufficiently smaller than Zs, and hence it is possible to easily obtain Zs through use of only one tilt angle Θ in Expression 1 by assigning L as a known value.

In this case, as described above, L is ascribable to the mounting errors (machine differences) among the sample stages 50 of individual focused ion beam apparatus and the measurement conditions (including an acceleration voltage) of the electron beam column 10.

Therefore, for example, as shown in FIG. 10A and FIG. 10B, an expected amount of L corresponding to the machine differences, relationships between the accelerating voltage and L, and other such information may be stored in the memory 6M of each individual focused ion beam apparatus in the form of a table, a mapping, a relational expression, and other such formats, and the control unit 6 may read out those formats including the table and the relational expression to estimate L in Step S4 of FIG. 3.

For example, as shown in FIG. 10A, only expected L based on the machine difference, which is specific to the focused ion beam apparatus, may be employed, or as shown in FIG. 10B, only expected L based on the acceleration voltage of the SEM may be employed. In addition, both values of expected L shown in FIG. 10A and FIG. 10B may be simply added to each other, or may be added to each other through predetermined weighting.

Therefore, Expression 1 is one simultaneous equation with one unknown (Zs), and hence Zs can be calculated.

It is to be understood that Zs may be assigned as a known value in place of L to calculate unknown L.

Figures 12, 13:
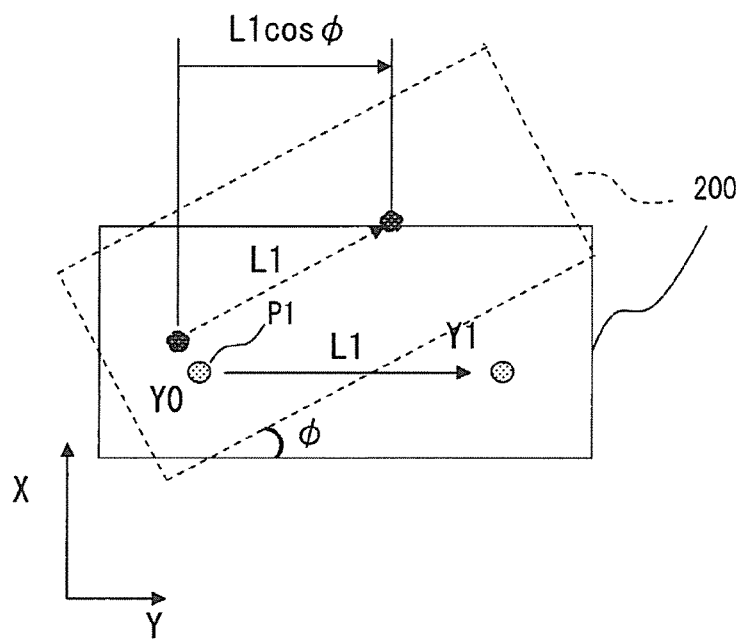
FIG. 12 shows a data structure of a table for showing a eucentric height and a deviation amount at predetermined plane coordinates of the sample, which is stored in a memory.
FIG. 13 is a diagram for illustrating a method of estimating the eucentric height through use of R values in the table of FIG. 12.

Next, with reference to FIG. 11 to FIG. 13, a method of easily estimating the eucentric height Zs is described.

As described above, it is possible to specifically calculate the eucentric height Zs at each of the irradiation positions P1 to P3 through use of, for example, Expression 3 in the first embodiment or Expression 1 in the second embodiment. However, for example, as the number of irradiation positions increases, the calculation requires more time, and the work efficiency may decrease.

In addition, when the FIB processing and the SEM observation or another such operation are performed at the plurality of irradiation positions P1 to P3, it is required to perform processing with the irradiation position P1 being adjusted to the eucentric height, and then move the sample stage 50 to readjust the irradiation position P2 to the eucentric height for processing. Thus, it is difficult to automate continuous processing and observation at the plurality of irradiation positions P1 to P3.

In view of this, a eucentric height Zse is calculated in advance for predetermined plane coordinates of the sample 200 placed on (the sample table 51 on) the sample stage 50 and stored in, for example, a mapping (table), and when the actual eucentric height Zs at each of the irradiation positions P1 to P3 can be estimated from the eucentric height Zse, the work efficiency is improved. In addition, it is not required to calculate the eucentric height Zs at each of the plurality of irradiation positions P1 to P3 every time processing is performed, and it is possible to automate continuous processing and observation at the plurality of irradiation positions P1 to P3.

Only the eucentric height Zs may be estimated, but when the deviation amount L occurs, it is preferred to estimate the deviation amount L together, and hence a case in which both the eucentric height Zs and the deviation amount L are estimated is described below.

FIG. 11 is an XY plan view of the sample 200 placed on (the sample table 51 on) the sample stage 50, and FIG. 12 shows a table 6T stored in the memory 6M.

As illustrated in FIG. 11, the eucentric heights Zse and deviation amounts Le at predetermined plane coordinates Eu1, Eu2, Eu3, Eu4 . . . of the sample 200 on the sample stage 50 are calculated in advance, and are stored in the memory 6M together with plane coordinates (X, Y) as the table 6T shown in FIG. 12. The R values shown in FIG. 12 are described later.

Subsequently, the movement amount calculation unit 6B refers to the eucentric heights Zse and the deviation amounts Le, which are stored in the memory 6M, to estimate the eucentric height Zs and the deviation amount L at the actual irradiation position P1.

In regard to this estimation, for example, as illustrated in FIG. 11, it is possible to extract two plane coordinates Eu3 and Eu4 from the table 6T in ascending order of a distance from the irradiation position P1 in an XY direction, and to estimate Zs and L from Zse and Le by an extrapolation method or an interpolation method based on, for example, an arrangement order of the Y coordinates of Eu3, Eu4, and P1.

Other irradiation positions P2, P3 . . . can be estimated in the same manner.

Thus, as illustrated in FIG. 11, it is possible to automate continuous processing and observation at the plurality of irradiation positions P1 to P3.

Each time the sample 200 is replaced, the eucentric height Zse is measured again, and the table 6T is also generated for each sample.

Incidentally, in the FIB processing and the SEM observation at the irradiation positions P1 . . . , there is a demand to perform processing by irradiating the sample 200 with the focused ion beam 20A with the sample 200 being tilted on the XY plane in order to facilitate the viewing in some cases. In this case, the sample 200 is rotated on an XY plane through use of the rotation mechanism 50r for rotating the sample table 51 about the Z-axis.

However, as illustrated in FIG. 13, there is a problem in that, in an exemplary case of rotation by a rotation angle $\varphi$, the deviation amount L in the Y direction differs from a case without the rotation. That is, when a rotation angle is 0, a deviation amount L1 is a value along the Y direction. Meanwhile, when the rotation angle is $\varphi$, the deviation amount L1 becomes a value along a direction forming the angle $\varphi$ with respect to the Y direction, and the component in the Y-axis direction becomes L1×cos $\varphi$, which is different from L1.

Then, in such a case, when the deviation amount Le measured with a rotation angle of 0 in the table 6T is referred to, the estimation accuracy of the deviation amount L at the actual irradiation position P1 decreases.

In view of this, in the table 6T of FIG. 12, the eucentric heights Zse and the deviation amounts Le are calculated in advance at the plane coordinates Eu1, Eu2, Eu3, Eu4 . . . with different R values (rotation angles). When the deviation amount L at the actual irradiation position P1 is estimated, the R value at the irradiation position P1 is acquired, and data having R close to the acquired R value is extracted from the table 6T and used for the estimation, to thereby improve the estimation accuracy.

For example, Eu2 and Eu7 have the same XY coordinates, but are different in R value. Therefore, the estimation may be performed through use of the eucentric height Zse and the deviation amount Le at one of Eu2 and Eu7, which is closer to the R value of the actual irradiation position P1.

In addition, it has already been described that the two plane coordinates Eu3 and Eu4 are extracted from the table 6T in the ascending order of the distance from the irradiation position P1 in the XY direction, but data to be extracted may be determined by comprehensively estimating the distance in the XY direction and a similarity degree between the R values.

It is to be understood that the present invention is not limited to the above-mentioned embodiments, and covers various modifications and equivalents included in the spirit and scope of the present invention.

For example, the method of calculating a eucentric height is not limited to the above-mentioned method.

What is claimed is:

1. A focused ion beam apparatus, comprising:
an electron beam column configured to irradiate a sample with an electron beam;
a focused ion beam column configured to irradiate the sample with a focused ion beam;
a sample stage, on which the sample is to be placed in one of a direct manner and an indirect manner, and which is tiltable about a tilt axis perpendicular to the electron beam and the focused ion beam and movable in a height direction;
a coordinate acquisition unit configured to acquire, when a plurality of irradiation positions to which the focused ion beam is to be applied are designated on the sample, plane coordinates of each of the plurality of irradiation positions;
a movement amount calculation unit configured to calculate, based on the plane coordinates, a movement amount by which the sample stage is to be moved to a first eucentric height (Zs) so that the first eucentric height (Zs) matches an intersection position at which the electron beam and the focused ion beam match each other at each of the plurality of irradiation positions;
a memory configured to store a second eucentric height (Zse) at predetermined plane coordinates on the surface of the sample placed on the sample stage; and
a sample stage movement control unit configured to move, based on the movement amount, the sample stage to the eucentric height (Zs) at each of the plurality of irradiation positions,
wherein the movement amount calculation unit is configured to estimate the first eucentric height (Zs) at each of the plurality of irradiation positions from the second eucentric height (Zse) stored in the memory based on a difference in coordinate between the predetermined plane coordinates and each of the plurality of irradiation positions.

2. The focused ion beam apparatus according to claim 1, wherein the movement amount calculation unit is configured to estimate the first eucentric height (Zs) at each of the plurality of irradiation positions from the second eucentric height (Zse) stored in the memory, based on an arrangement order in coordinate among the predetermined plane coordinates and each of the plurality of irradiation positions.

* * * * *